US010784843B2

United States Patent
Hsu et al.

(10) Patent No.: US 10,784,843 B2
(45) Date of Patent: Sep. 22, 2020

(54) INVERTER WITH CONTROL VOLTAGE GENERATING CIRCUIT CAPABLE OF WITHSTANDING HIGH VOLTAGE

(71) Applicant: REALTEK SEMICONDUCTOR CORPORATION, Hsinchu (TW)

(72) Inventors: Hsin-Cheng Hsu, Hsinchu County (TW); Tay-Her Tsaur, Hsinchu County (TW); Po-Ching Lin, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/687,750

(22) Filed: Nov. 19, 2019

(65) Prior Publication Data

US 2020/0162060 A1 May 21, 2020

(30) Foreign Application Priority Data

Nov. 20, 2018 (TW) .............................. 107141182 A

(51) Int. Cl.
*H03K 3/00* (2006.01)
*H03K 19/003* (2006.01)
(Continued)

(52) U.S. Cl.
CPC .................. *H03K 3/0375* (2013.01)

(58) Field of Classification Search
CPC .................................................. H03K 3/0375
See application file for complete search history.

(56) References Cited

U.S. PATENT DOCUMENTS 5,440,249 A * 8/1995 Schucker ......... H03K 3/356113
326/81
6,509,759 B1 * 1/2003 Hynes .............. H03K 17/08122
326/81
(Continued)

FOREIGN PATENT DOCUMENTS

JP         2002315360 A     10/2002

OTHER PUBLICATIONS

OA letter of counterpart TW application of application No. 107141182 dated Jan. 21, 2019. Summary of TW OA letter: Claims 1, 4 are rejected as being unpatentable over the cited reference 1 (JP_2002315360_A) in view of the cited reference 2 (US_20160036419_A1). Claim 7 is rejected as being unpatentable over the cited reference 3 (US_20100188144_A1). Claim 8 is rejected as being unpatentable over the Cited reference 1 in view of the cited reference 3 (US_20100188144_A1).

*Primary Examiner* — Kenneth B Wells
(74) *Attorney, Agent, or Firm* — WPAT, PC

(57) ABSTRACT

Disclosed is an inverter capable of withstanding a high voltage. The inverter includes a control voltage generating circuit, a high voltage transmission circuit, and a low voltage transmission circuit. The control voltage generating circuit generates a first group of control voltages and a second group of control voltages according to an input voltage, in which one group includes decrement voltages and the other group includes identical voltages. The high/low voltage transmission circuit is coupled between a high/low voltage terminal and an output terminal, wherein when the input voltage is low/high, the high/low voltage transmission circuit is turned on according to the first/second group of control voltages so that an output voltage of the output terminal is equal to a high/low voltage of the high/low voltage terminal.

19 Claims, 7 Drawing Sheets

(51) Int. Cl.
    *H03K 19/00*    (2006.01)
    *H03K 3/037*    (2006.01)

(56)            References Cited

U.S. PATENT DOCUMENTS 6,518,818 B1 *  2/2003  Hynes ............... H03K 19/00315
                                                        327/333
    6,700,418 B2 *  3/2004  Yu ..................... H03K 19/0005
                                                         326/83
    6,870,407 B2 *  3/2005  Lundberg ......... H03K 19/00315
                                                         326/81
    7,570,088 B1 *  8/2009  Ku ................... H03K 19/00315
                                                        327/112
 2010/0188144 A1    7/2010  Iriguchi
 2016/0036419 A1    2/2016  Lin

* cited by examiner

US 10,784,843 B2

INVERTER WITH CONTROL VOLTAGE GENERATING CIRCUIT CAPABLE OF WITHSTANDING HIGH VOLTAGE

BACKGROUND OF THE INVENTION

1. Field of the Invention

The present invention relates to an inverter, especially to an inverter capable of preventing a high voltage from damaging the circuits of the inverter.

2. Description of Related Art

FIG. 1 shows a conventional CMOS inverter 100. The inverter 100 includes a PMOS transistor 110 and an NMOS transistor 120. The PMOS transistor 110 is coupled between a high voltage supply terminal and an output terminal; the PMOS transistor 110 is turned off when the voltage $V_{IN}$ of an input terminal is equal to the voltage $V_{DD}$ of the high voltage supply terminal, and turned on when the voltage $V_{IN}$ is equal to the voltage $V_{SS}$ of a low voltage supply terminal. When the PMOS 110 is turned on, the voltage $V_{OUT}$ of the output terminal is equal to $V_{DD}$. The NMOS transistor 120 is coupled between the output terminal and the low voltage supply terminal; the NMOS transistor 120 is turned on when $V_{IN}$ is equal to $V_{DD}$, and turned off when $V_{IN}$ is equal to $V_{SS}$; when the NMOS transistor 120 is turned on, $V_{OUT}$ is equal to $V_{SS}$.

As CMOS techniques develop, the transistor size is scaled down to reduce circuit area so that the operation speed and the power consumption are improved. However, the gate oxide layer and the transistor channel are scaled down as the transistor size is scaled down; consequently, the maximum allowable voltage drop (a.k.a. rated voltage) between any two terminals (e.g., two terminals among gate, drain, source, and base) of a transistor is decreased as well. If the voltage drop of any two terminals of a transistor is higher than the rated voltage, the transistor could be damaged. Since the rated voltage of a transistor manufactured with an advanced CMOS process trends down, a CMOS inverter of conventional architecture (e.g., the inverter 100 of FIG. 1) faces a problem that the voltage of a high voltage supply terminal is likely to be higher than the rated voltage of a transistor of the CMOS inverter and thus the transistor could be damaged.

SUMMARY OF THE INVENTION

An object of the present invention is to provide an inverter which prevents a high voltage from damaging the circuits of the inverter.

An embodiment of the inverter of the present invention includes a control voltage generating circuit, a high voltage transmission circuit, and a low voltage transmission circuit. The control voltage generating circuit is coupled to an input terminal and configured to generate a plurality of control voltages according to an input voltage of the input terminal, in which the plurality of control voltages includes a first group of control voltages and a second group of control voltages, one group of the first group of control voltages and the second group of control voltages includes decrement voltages while the other group of the first group of control voltages and the second group of control voltages includes identical voltages. The high voltage transmission circuit is coupled between a high voltage terminal and an output terminal, and configured to be turned on according to the first group of control voltages when the input voltage is a low-level voltage so that an output voltage of the output terminal is equal to a high voltage of the high voltage terminal. The low voltage transmission circuit is coupled between the output terminal and a low voltage terminal, and configured to be turned on according to the second group of control voltages when the input voltage is a high-level voltage so that the output voltage of the output terminal is equal to a low voltage of the low voltage terminal.

Another embodiment of the inverter of the present invention includes a control voltage generating circuit, a high voltage transmission circuit, and a low voltage transmission circuit. The control voltage generating circuit is coupled to an input terminal and configured to generate a plurality of control voltages according to an input voltage of the input terminal, in which the plurality of control voltages includes a first group of control voltages and a second group of control voltages. The high voltage transmission circuit includes first-type transistors; the high voltage transmission circuit is coupled between a high voltage terminal and an output terminal, and configured to be turned on according to the first group of control voltages when the input voltage is a low-level voltage so that an output voltage of the output terminal is equal to a high voltage of the high voltage terminal. The low voltage transmission circuit includes second-type transistors; the low voltage transmission circuit is coupled between the output terminal and a low voltage terminal, and configured to be turned on according to the second group of control voltages when the input voltage is a high-level voltage so that the output voltage of the output terminal is equal to a low voltage of the low voltage terminal. Each of the first-type transistors and the second-type transistors withstands a rated voltage; the high-level voltage and/or the high voltage is higher than M times the rated voltage but not higher than (M+1) times the rated voltage, in which M is a positive integer; and a voltage drop between any two terminals of each of the first-type transistors and the second-type transistors is not higher than the rated voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this technical field. If any term is defined in the following description, such term should be explained accordingly.

The present invention discloses an inverter capable of preventing a high voltage (e.g., the high voltage mentioned in the later paragraphs) from damaging the circuits of the inverter, in which the high voltage could be higher than the rated voltage of the circuits (e.g., transistors) of the inverter.

Figure 1:
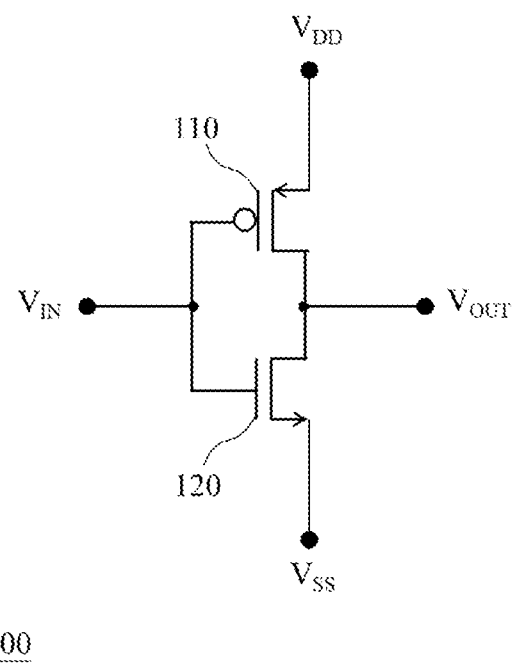
FIG. 1 shows a conventional inverter.
Figure 2:
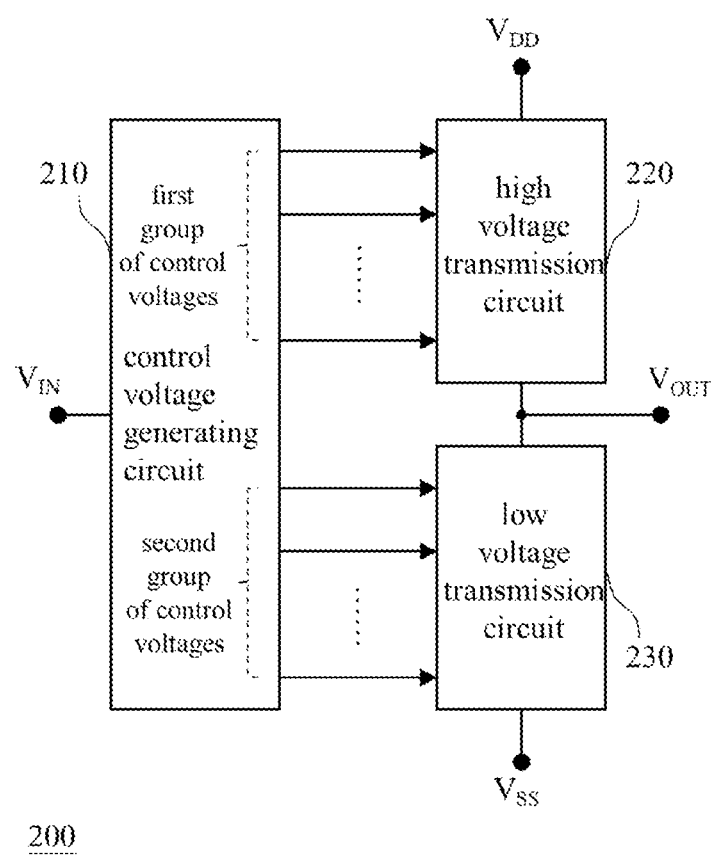
FIG. 2 shows an embodiment of the inverter of the present invention.

FIG. 2 shows an embodiment of the inverter of the present invention. The inverter 200 of FIG. 2 shows a control voltage generating circuit 210, a high voltage transmission circuit 220, and a low voltage transmission circuit 230.

Please refer to FIG. 2. The control voltage generating circuit 210 is coupled to an input terminal and configured to generate a plurality of control voltages according to an input voltage $V_{IN}$ of the input terminal. The plurality of control voltages includes a first group of control voltages and a second group of control voltages; one group of the first group of control voltages and the second group of control voltages includes decrement voltages, and the other group of the first group of control voltages and the second group of control voltages includes identical voltages. When the input voltage $V_{IN}$ is a high-level voltage (e.g., high supply voltage $V_{DD}$), the first group of control voltages includes decrement voltages and the second group of control voltages includes identical voltages. When the input voltage $V_{IN}$ is a low-level voltage (e.g., low supply voltage $V_{SS}$), the first group of control voltages includes identical voltages and the second group of control voltages includes decrement voltages. For better understanding of the present invention, the high-level voltage of this embodiment is equal to $V_{DD}$ and the low-level voltage of this embodiment is equal to $V_{SS}$; however, the implementation of the present invention is not limited thereto. It should be noted that the decrement voltages of the first group of control voltages could be the same as or different from the decrement voltages of the second group of control voltages.

Please refer to FIG. 2. The high voltage transmission circuit 220 is coupled between a high voltage terminal (e.g., high voltage supply terminal) and an output terminal. The high voltage transmission circuit 220 is configured to be turned on (i.e., electrically conductive) according to the first group of control voltages when the input voltage $V_{IN}$ is a low-level voltage $V_{SS}$ so that an output voltage $V_{OUT}$ of the output terminal is equal to a high voltage (e.g., the voltage $V_{DD}$ of the high voltage supply terminal) of the high voltage terminal; meanwhile, the low voltage transmission circuit 230 is turned off (i.e., electrically nonconductive) according to the second group of control voltages. For better understanding of the present invention, the high voltage of this embodiment is equal to $V_{DD}$; however, the implementation of the present invention is not limited thereto.

Please refer to FIG. 2. The low voltage transmission circuit 230 is coupled between the output terminal and a low voltage terminal (e.g., a low voltage supply terminal). The low voltage transmission circuit 230 is configured to be turned on (i.e., electrically conductive) according to the second group of control voltages when the input voltage $V_{IN}$ is the high-level voltage $V_{DD}$ so that the output voltage $V_{OUT}$ of the output terminal is equal to a low voltage (e.g., the voltage $V_{SS}$ of the low voltage supply terminal) of the low voltage terminal; in the meantime, the high voltage transmission circuit 220 is turned off (i.e., electrically nonconductive) according to the first group of control voltages. For better understanding of the present invention, the low voltage of this embodiment is equal to $V_{SS}$; however, the implementation of the present invention is not limited thereto.

Figure 3:
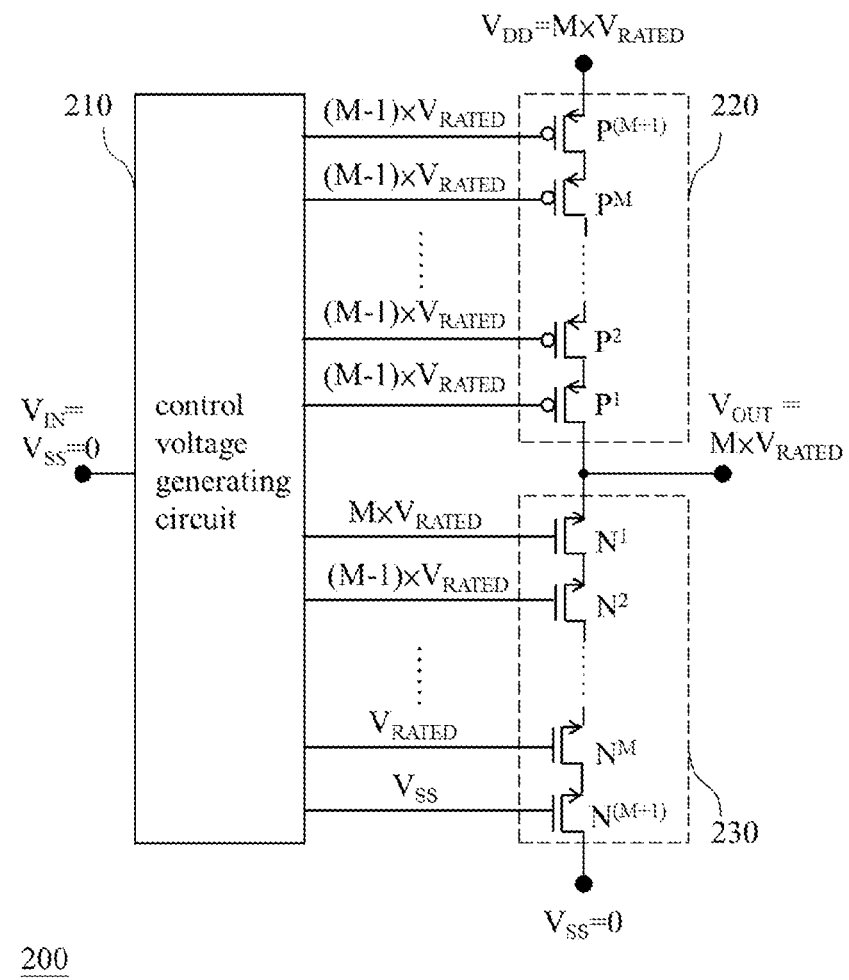
FIG. 3 shows an exemplary implementation of the embodiment of FIG. 2.

FIG. 3 shows an exemplary implementation of the embodiment of FIG. 2. As shown in FIG. 3, the high voltage transmission circuit 220 includes PMOS transistors $P^1$, $P^2$, ..., $P^M$, and $P^{(M+1)}$, in which M is an integer greater than one; the low voltage transmission circuit 230 includes NMOS transistors $N^1$, $N^2$, ..., $N^M$, and $N^{(M+1)}$; and each of the PMOS transistors and the NMOS transistors withstands a rated voltage $V_{RATED}$. If one of the PMOS and NMOS transistors can merely withstand a rated voltage not higher than any of the rated voltages of the other transistors, this minimum rated voltage is treated as the rated voltage $V_{RATED}$ for all of the transistors in this embodiment. In addition, in FIG. 3 the input voltage $V_{IN}$ is equal to $V_{SS}$, the high voltage $V_{DD}$ of the high voltage terminal is M times $V_{RATED}$ (i.e., $M \times V_{RATED}$), and the low voltage $V_{SS}$ of the low voltage terminal is 0V. On the basis of the above, the control voltage generating circuit 210 of FIG. 3 generates the first group of control voltages including first identical voltages $(M-1) \times V_{RATED}$ used as the aforementioned identical voltages; the control voltage generating circuit 210 of FIG. 3 also generates the second group of control voltages including voltages $M \times V_{RATED}$, $(M-1) \times V_{RATED}$, ..., $V_{RATED}$, and $V_{SS}$ that are used as the aforementioned decrement voltages. According to FIG. 3, since the gate voltage $(M-1) \times V_{RATED}$ of each of the PMOS transistors is lower than the high voltage $V_{DD} = M \times V_{RATED}$ of the high voltage terminal, these PMOS transistors are turned on and thereby the output voltage $V_{OUT}$ is substantially equal to the high voltage $V_{DD} = M \times V_{RATED}$. Furthermore, since the gate voltage of the NMOS transistor $N^{(M+1)}$ is $V_{SS}$ that is not higher than the low voltage $V_{SS}$ of the low voltage terminal, the NMOS transistor $N^{(M+1)}$ is turned off. For the rest of the NMOS transistors, each NMOS transistor has a source voltage between the gate voltage of this NMOS transistor and the gate voltage of the next NMOS transistor; for instance, regarding the NMOS transistor $N^M$ of FIG. 3, the source voltage $V_{SOURCE\_NM}$ of this NMOS transistor $N^M$ is $(V_{RATED} - V_{th})$ (in which $V_{th}$ is the threshold voltage for the NMOS transistor $N^M$ being turned on), the gate voltage $V_{GATE\_NM}$ of this NMOS transistor $N^M$ is $V_{RATED}$, the gate voltage $V_{GATE\_N(M+1)}$ of the next NMOS transistor $N^{(M+1)}$ is $V_{SS}$, and accordingly the source voltage $V_{SOURCE\_NM}$ is between the gate voltage $V_{GATE\_NM} = V_{RATED}$ and the gate voltage $V_{GATE\_N(M+1)} = V_{SS}$ (i.e., $V_{GATE\_N(M+1)} = V_{SS} < V_{SOURCE\_NM} < V_{GATE\_NM} = V_{RATED}$). In FIG. 3, the voltage drop of any two terminals of each transistor is not higher than the rated voltage $V_{RATED}$; as a result, even though the high voltage $V_{DD} = M \times V_{RATED}$ of the high voltage terminal is higher than the rated voltage $V_{RATED}$, this high voltage $V_{DD}$ won't damage any transistor.

Figure 4:
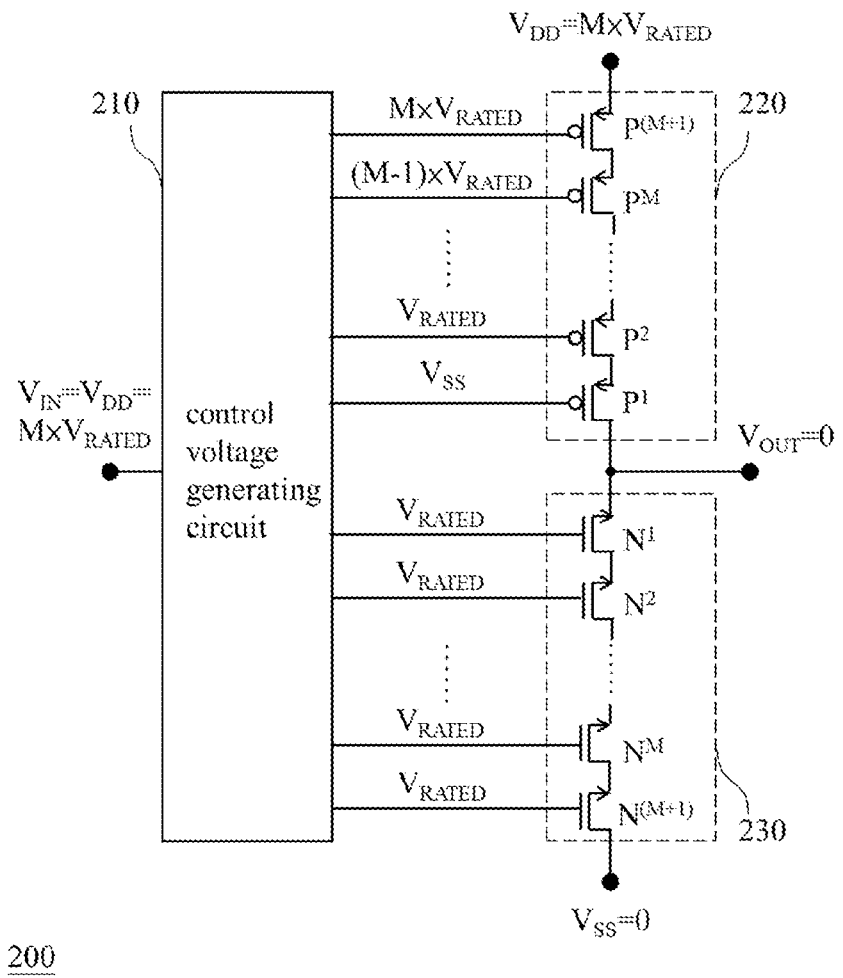
FIG. 4 shows another exemplary implementation of the embodiment of FIG. 2.

FIG. 4 shows another exemplary implementation of the embodiment of FIG. 2. In comparison with FIG. 3, in FIG. 4 the input voltage $V_{IN}$ is equal to $V_{DD}$. Accordingly, the control voltage generating circuit 210 of FIG. 4 generates the first group of control voltages including voltages $M \times V_{RATED}$, $(M-1) \times V_{RATED}$, ..., $V_{RATED}$, and $V_{SS}$ that are used as the aforementioned decrement voltages; the control voltage generating circuit 210 of FIG. 3 also generates the second group of control voltages including second identical voltages $V_{RATED}$ used as the aforementioned identical voltages. According to FIG. 4, since the gate voltage of the PMOS transistor $P^{(M+1)}$ is $M \times V_{RATED}$ that is not lower than the high voltage $V_{DD} = M \times V_{RATED}$ of the high voltage terminal, the PMOS transistor $P^{(M+1)}$ is turned off. For the rest of the PMOS transistors, each PMOS transistor has a source voltage between the gate voltage of this PMOS transistor and the gate voltage of the preceding PMOS transistor; for instance, regarding the PMOS transistor $P^1$ of FIG. 4, the source voltage $V_{SOURCE\_P1}$ of this PMOS transistor $P^1$ is ($V_{SS}+V_{th}=V_{th}$) (in which $V_{th}$ is the threshold voltage for the PMOS transistor $P^1$ being turned on), the gate voltage $V_{GATE\_P1}$ of this PMOS transistor $P^1$ is $V_{SS}$, the gate voltage $V_{GATE\_P2}$ of the preceding PMOS transistor $P^2$ is $V_{RATED}$, and accordingly the source voltage $V_{SOURCE\_P1}$ is between the gate voltage $V_{GATE\_P1}=V_{SS}$ and the gate voltage $V_{GATE\_P2}=V_{RATED}$ (i.e., $V_{GATE\_P1}=V_{SS}<V_{SOURCE\_P1}<V_{GATE\_P2}=V_{RATED}$). Furthermore, since the gate voltage $V_{RATED}$ of each of the NMOS transistors is higher than the low voltage $V_{SS}$ of the low voltage terminal, these NMOS transistors are turned on and thereby the output voltage $V_{OUT}$ is equal to the low voltage $V_{SS}$. In FIG. 4, the voltage drop of any two terminals of each transistor is not higher than the rated voltage $V_{RATED}$; as a result, even though the high voltage $V_{DD}=M\times V_{RATED}$ of the high voltage terminal is higher than the rated voltage $V_{RATED}$, this high voltage $V_{DD}$ won't damage any transistor.

Figure 5:
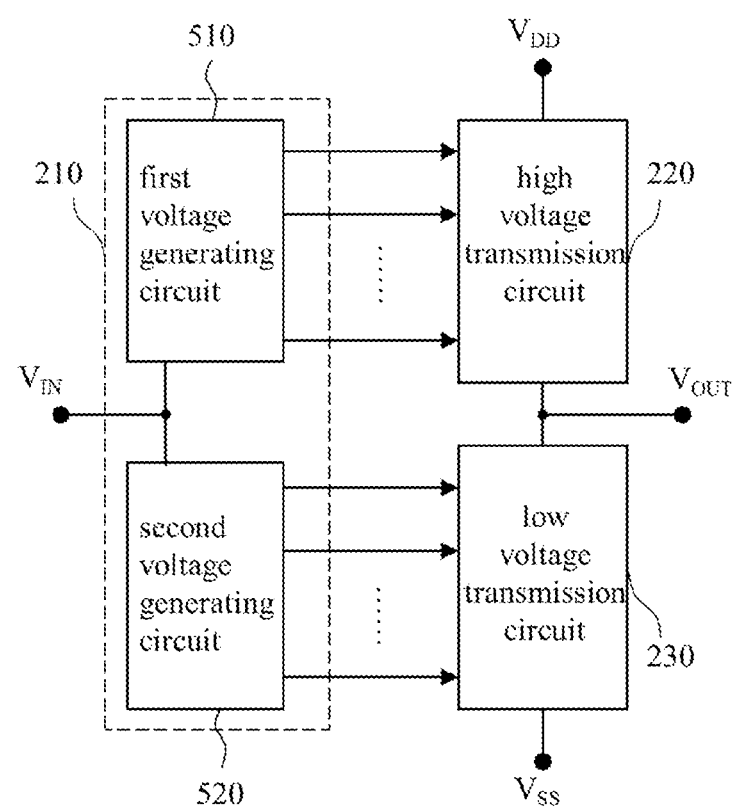
FIG. 5 shows an embodiment of the control voltage generating circuit of FIG. 2.

FIG. 5 shows an embodiment of the control voltage generating circuit 210 of FIG. 2. As shown in FIG. 5, the control voltage generating circuit 210 includes a first voltage generating circuit 510 and a second voltage generating circuit 520. The first voltage generating circuit 510 is configured to generate the first group of control voltages; when the input voltage $V_{IN}$ is equal to the low-level voltage $V_{ss}$, the first voltage generating circuit 510 outputs first identical voltages (as shown in FIG. 3) as the aforementioned identical voltages; when the input voltage $V_{IN}$ is equal to the high-level voltage $V_{DD}$, the first voltage generating circuit 510 outputs decrement voltages (as shown in FIG. 4). The second voltage generating circuit 520 is configured to generate the second group of control voltages; when the input voltage $V_{IN}$ is equal to the high-level voltage $V_{DD}$, the second voltage generating circuit 520 outputs second identical voltages (as shown in FIG. 4) as the identical voltages; when the input voltage $V_{IN}$ is equal to the low-level voltage $V_{ss}$, the second voltage generating circuit 520 outputs decrement voltages (as shown in FIG. 3). An example of the decrement voltages of the first/second voltage generating circuit 510/520 is $V_{DD}$, $(V_{DD}-V_{RATED})$, $(V_{DD}-2\times V_{RATED})$, ..., $[V_{DD}-(M-1)\times V_{RATED}]$, and $V_{ss}$; another example of the decrement voltages is $V_{DD}$, $[V_{ss}+(M-1)\times V_{RATED}]$, ..., $(V_{SS}+2\times V_{RATED})$, $(V_{SS}+V_{RATED})$, and $V_{ss}$; in the above two examples, M is an integer greater than one and the equation $\{V_{DD}-[V_{ss}+(M-1)\times V_{RATED}]\} \le V_{RATED}$ holds.

Figure 6:
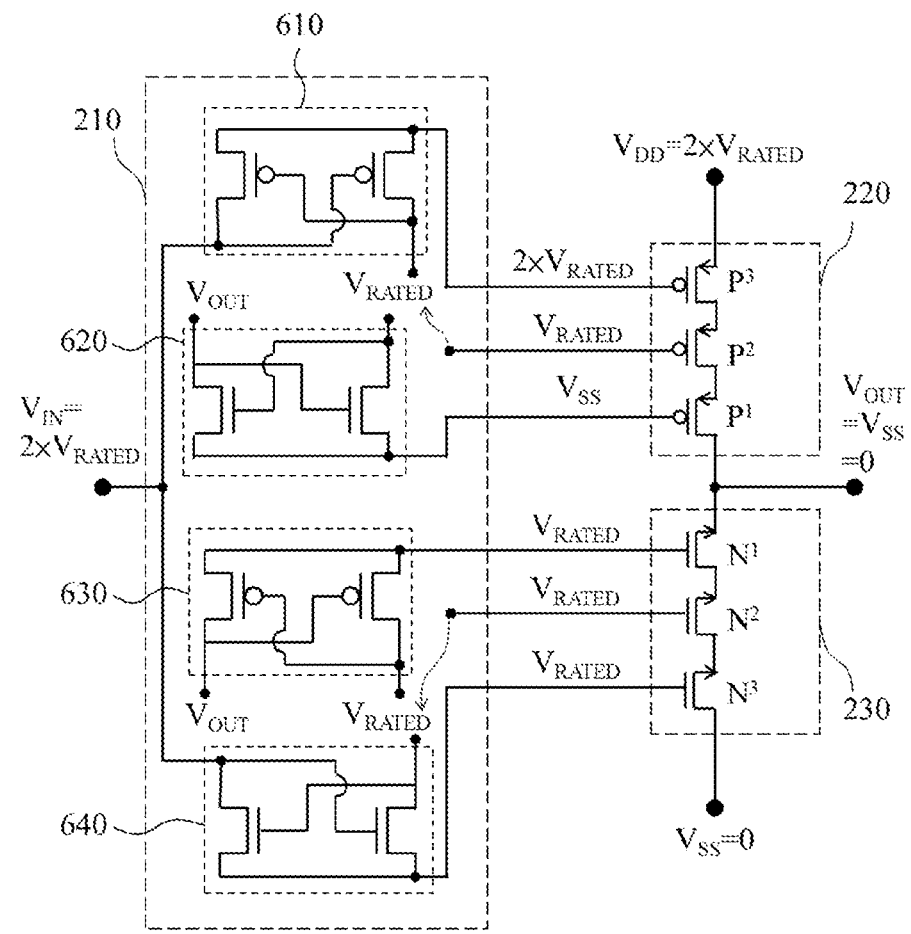
FIG. 6 shows an exemplary implementation of the embodiment of FIG. 5.

FIG. 6 shows an exemplary implementation of the embodiment of FIG. 5. As shown in FIG. 6, the high voltage transmission circuit 220 includes PMOS transistors $P^3$, $P^2$, $P^1$, the low voltage transmission circuit 230 includes NMOS transistors $N^3$, $N^2$, $N^1$, each of these PMOS and NMOS transistors withstands a rated voltage $V_{RATED}$. In addition, the control voltage generating circuit 210 of FIG. 6 includes a first comparing circuit 610, a second comparing circuit 620, a third comparing circuit 630, and a fourth comparing circuit 640, in which the first comparing circuit 610 and the second comparing circuit 620 are included in the aforementioned first voltage generating circuit 510, and the third comparing circuit 630 and the fourth comparing circuit 640 are included in the aforementioned second voltage generating circuit 520. As shown in FIG. 6, when the input voltage $V_{IN}=V_{DD}=2\times V_{RATED}$, the first comparing circuit 610 outputs the higher one (i.e., $2\times V_{RATED}$) among the input voltage $V_{IN}=2\times V_{RATED}$ and the rated voltage $V_{RATED}$ as the gate voltage of the PMOS transistor $P^3$, and the rated voltage $V_{RATED}$ is used as the gate voltage of the PMOS transistor $P^2$; the second comparing circuit 620 outputs the lower one (i.e., $V_{SS}$) among the output voltage $V_{OUT}=V_{SS}=0$ and the rated voltage $V_{RATED}$ as the gate voltage of the PMOS transistor $P^1$; the third comparing circuit 630 outputs the higher one (i.e., $V_{RATED}$) among the output voltage $V_{OUT}=V_{SS}$ and the rated voltage $V_{RATED}$ as the gate voltage of the NMOS transistor $N^1$, and the rated voltage $V_{RATED}$ is used as the gate voltage of the NMOS transistor $N^2$; the fourth comparing circuit 640 outputs the lower one (i.e., $V_{RATED}$) among the input voltage $V_{IN}=2\times V_{RATED}$ and the rated voltage $V_{RATED}$ as the gate voltage of the NMOS transistor $N^3$. In light of the above, since the high voltage $2\times V_{RATED}$ (i.e., the source voltage of the PMOS transistor $P^3$) of the high voltage terminal is not higher than the gate voltage $(2\times V_{RATED})$ of the PMOS transistor $P^3$, the PMOS transistor $P^3$ is turned off and thereby the high voltage transmission circuit 220 is turned off (i.e., electrically nonconductive); moreover, since the low voltage $V_{SS}=0$ of the low voltage terminal is lower than the gate voltage $(V_{RATED})$ of each of the NMOS transistors $N^3$, $N^2$, $N^1$, these NMOS transistors $N^3$, $N^2$, $N^1$ are turned on and thereby the output voltage $V_{OUT}$ is equal to the low voltage $V_{SS}$.

Figure 7:
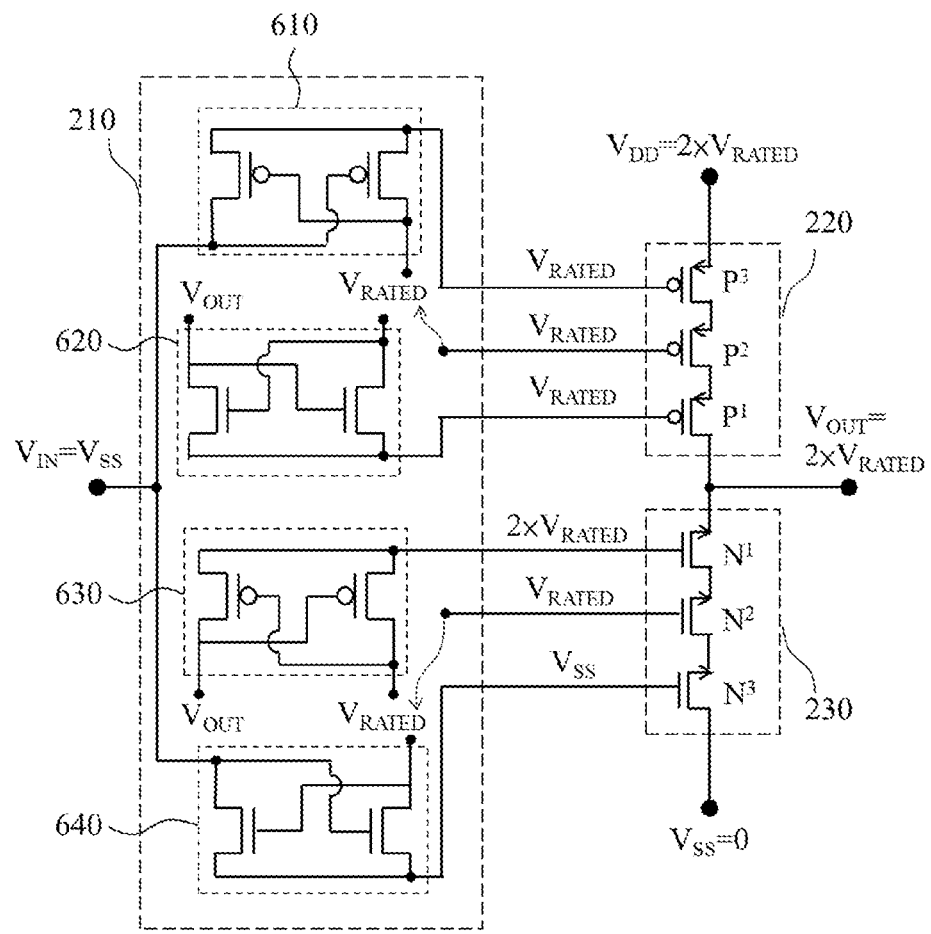
FIG. 7 shows another exemplary implementation of the embodiment of FIG. 5.

FIG. 7 shows another exemplary implementation of the embodiment of FIG. 5.

In comparison with FIG. 6, the input voltage $V_{IN}$ of FIG. 7 is equal to $V_{SS}=0$; therefore, the first comparing circuit 610 outputs the higher one (i.e., $V_{RATED}$) among the input voltage $V_{IN}=0$ and the rated voltage $V_{RATED}$ as the gate voltage of the PMOS transistor $P^3$, and the rated voltage $V_{RATED}$ is used as the gate voltage of the PMOS transistor $P^2$; the second comparing circuit 620 outputs the lower one (i.e., $V_{RATED}$) among the output voltage $V_{OUT}=V_{DD}=2\times V_{RATED}$ and the rated voltage $V_{RATED}$ as the gate voltage of the PMOS transistor $P^1$; the third comparing circuit 630 outputs the higher one (i.e., $2\times V_{RATED}$) among the output voltage $V_{OUT}=2\times V_{RATED}$ and the rated voltage $V_{RATED}$ as the gate voltage of the NMOS transistor $N^1$, and the rated voltage $V_{RATED}$ is used as the gate voltage of the NMOS transistor $N^2$; and the fourth comparing circuit 640 outputs the lower one (i.e., $V_{SS}$) among the input voltage $V_{IN}=V_{SS}=0$ and the rated voltage $V_{RATED}$ as the gate voltage of the NMOS transistor $N^3$. In light of the above, since the high voltage $2\times V_{RATED}$ of the high voltage terminal is higher than the gate voltage (i.e., $V_{RATED}$) of each of the PMOS transistors $P^3$, $P^2$, $P^1$, the PMOS transistors $P^3$, $P^2$, $P^1$ are turned on and thereby the output voltage $V_{OUT}$ is equal to the high voltage $V_{DD}$; furthermore, since the low voltage $V_{SS}$ (i.e., the source voltage of the NMOS transistor $N^3$) of the low voltage terminal is not lower than the gate voltage $(V_{SS})$ of the NMOS transistor $N^3$, the NMOS transistor $N^3$ is turned off and thereby the low voltage transmission circuit 230 is turned off (i.e., electrically nonconductive).

Any of the aforementioned embodiments/exemplary implementations can include one of the following features. The high voltage transmission circuit 220 and the low voltage transmission circuit 230 are connected in series; the high-level voltage of the input terminal and/or the high voltage of the high voltage terminal can be higher than M times the rated voltage but not higher than (M+1) times the rated voltage, in which M is a positive integer; the number of the first-type transistors is equal to (M+1) and the number of the second-type transistors is also equal to (M+1); the voltage drop between any two terminals of each of the first-type and second-type transistors is not higher than the rated voltage; a voltage difference between two successive voltages of the decrement voltages is not higher than the rated voltage; each of the identical voltages is equal to the rated voltage or equal to the high voltage minus the rated voltage; and the gate and source of each transistor can optionally be short-circuited, or the gate can optionally receive a voltage (e.g., a voltage the same as or similar to the voltage of the above-mentioned source) generated by the control voltage generating circuit 210.

It should be noted that people of ordinary skill in the art can implement the present invention by selectively using some or all of the features of any embodiment in this specification or selectively using some or all of the features of multiple embodiments in this specification as long as this implementation is practicable, which implies that the present invention can be carried out flexibly.

To sum up, the inverter of the present invention can prevent a voltage (e.g., the aforementioned high voltage) from damaging the circuits of the inverter even though the voltage is higher than the rated voltage of the circuits of the inverter.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An apparatus, comprising:
   a control voltage generating circuit coupled to an input terminal and configured to generate a plurality of control voltages according to an input voltage of the input terminal, the plurality of control voltages including a first group of control voltages and a second group of control voltages, one group of the first group of control voltages and the second group of control voltages including decrement voltages while the other group of the first group of control voltages and the second group of control voltages including identical voltages;
   a high voltage transmission circuit coupled between a high voltage terminal and an output terminal and configured to be turned on according to the first group of control voltages when the input voltage is a low-level voltage, so that an output voltage of the output terminal is equal to a high voltage of the high voltage terminal; and
   a low voltage transmission circuit coupled between the output terminal and a low voltage terminal and configured to be turned on according to the second group of control voltages when the input voltage is a high-level voltage, so that the output voltage of the output terminal is equal to a low voltage of the low voltage terminal.

2. The apparatus of claim 1, wherein the control voltage generating circuit includes:
   a first voltage generating circuit configured to generate the first group of control voltages, wherein when the input voltage is the low-level voltage, the first voltage generating circuit outputs first identical voltages used as the identical voltages, and when the input voltage is the high-level voltage, the first voltage generating circuit outputs the decrement voltages; and
   a second voltage generating circuit configured to generate the second group of control voltages, wherein when the input voltage is the low-level voltage, the second voltage generating circuit outputs the decrement voltages, and when the input voltage is the high-level voltage, the second voltage generating circuit outputs second identical voltages used as the identical voltages.

3. The apparatus of claim 2, wherein the high voltage transmission circuit includes first-type transistors; the low voltage transmission circuit includes second-type transistors; each of the first-type transistors and the second-type transistors withstands a rated voltage; each of the first identical voltages is equal to the high voltage minus the rated voltage; each of the second identical voltages is equal to the rated voltage; and the first-type transistors are PMOS transistors while the second-type transistors are NMOS transistors, or the first-type transistors are NMOS transistors while the second-type transistors are PMOS transistors.

4. The apparatus of claim 1, wherein the low-level voltage is equal to the low voltage and the high-level voltage is equal to the high voltage.

5. The apparatus of claim 1, wherein the high voltage transmission circuit includes first-type transistors; the low-voltage transmission circuit includes second-type transistors; each of the first-type transistors and the second-type transistors withstands a rated voltage; and the first-type transistors are PMOS transistors while the second-type transistors are NMOS transistors, or the first-type transistors are NMOS transistors while the second-type transistors are PMOS transistors.

6. The apparatus of claim 5, wherein at least one of the high-level voltage and the high voltage is higher than M times the rated voltage but not higher than (M+1) times the rated voltage, and M is a positive integer.

7. The apparatus of claim 6, wherein the number of the first-type transistors is (M+1), and the number of the second-type transistors is (M+1).

8. The apparatus of claim 6, wherein a voltage drop between any two terminals of each of the first-type transistors and the second-type transistors is not higher than the rated voltage.

9. The apparatus of claim 6, wherein a voltage difference between two successive voltages of the decrement voltages is not higher than the rated voltage.

10. The apparatus of claim 6, wherein each of the identical voltages is equal to the rated voltage or equal to the high voltage minus the rated voltage.

11. The apparatus of claim 5, wherein a voltage drop between any two terminals of each of the first-type transistors and the second-type transistors is not higher than the rated voltage.

12. The apparatus of claim 5, wherein a voltage difference between two successive voltages of the decrement voltages is not higher than the rated voltage.

13. The apparatus of claim 5, wherein each of the identical voltages is equal to the rated voltage or equal to the high voltage minus the rated voltage.

14. An apparatus, comprising:
   a control voltage generating circuit coupled to an input terminal and configured to generate a plurality of control voltages according to an input voltage of the input terminal, the plurality of control voltages including a first group of control voltages and a second group of control voltages, in which one group of the first group of control voltages and the second group of control voltages includes decrement voltages while the other group of the first group of control voltages and the second group of control voltages includes identical voltages;
   a high voltage transmission circuit including first-type transistors, coupled between a high voltage terminal and an output terminal and configured to be turned on according to the first group of control voltages when the input voltage is a low-level voltage, so that an output voltage of the output terminal is equal to a high voltage of the high voltage terminal; and a low voltage transmission circuit including second-type transistors, coupled between the output terminal and a low voltage terminal and configured to be turned on according to the second group of control voltages when the input voltage is a high-level voltage, so that the output voltage of the output terminal is equal to a low voltage of the low voltage terminal, wherein each of the first-type transistors and the second-type transistors withstands a rated voltage; the high-level voltage and/or the high voltage is higher than M times the rated voltage but not higher than (M+1) times the rated voltage; M is a positive integer; a voltage drop between any two terminals of each of the first-type transistors and the second-type transistors is not higher than the rated voltage; and the first-type transistors are PMOS transistors while the second-type transistors are NMOS transistors, or the first-type transistors are NMOS transistors while the second-type transistors are PMOS transistors.

15. The apparatus of claim 14, wherein a voltage difference between two successive voltages of the decrement voltages is equal to the rated voltage.

16. The apparatus of claim 14, wherein each of the identical voltages is equal to the rated voltage or equal to the high voltage minus the rated voltage.

17. The apparatus of claim 14, wherein a number of the first-type transistors is (M+1) and a number of the second-type transistors is (M+1).

18. The apparatus of claim 14, wherein the control voltage generating circuit includes:
a first voltage generating circuit configured to output first identical voltages to control the first-type transistors when the input voltage is the low-level voltage, and the first voltage generating circuit configured to output decrement voltages to control the first-type transistors when the input voltage is the high-level voltage; and
a second voltage generating circuit configured to output the decrement voltages to control the second-type transistors when the input voltage is the low-level voltage, and the second voltage generating circuit configured to output second identical voltages to control the second-type transistors when the input voltage is the high-level voltage.

19. The apparatus of claim 18, wherein each of the first identical voltages is equal to the high voltage minus the rated voltage, and each of the second identical voltages is equal to the rated voltage.

\* \* \* \* \*